(12) United States Patent
Jourdan et al.

(10) Patent No.: US 9,581,188 B2
(45) Date of Patent: Feb. 28, 2017

(54) MECHANICAL CONNECTION FORMING A PIVOT FOR MEMS AND NEMS MECHANICAL STRUCTURES

(71) Applicant: COMMISSARIAT A L'ENERGIE ATOMIQUE ET AUX ENE ALT, Paris (FR)

(72) Inventors: Guillaume Jourdan, Grenoble (FR); Dirk Ettelt, Gelsenkirchen (DE); Patrice Rey, St Jean de Moirans (FR); Arnaud Walther, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 6 days.

(21) Appl. No.: 14/364,348

(22) PCT Filed: Dec. 12, 2012

(86) PCT No.: PCT/EP2012/075278
§ 371 (c)(1),
(2) Date: Jun. 11, 2014

(87) PCT Pub. No.: WO2013/087717
PCT Pub. Date: Jun. 20, 2013

(65) Prior Publication Data
US 2014/0331770 A1  Nov. 13, 2014

(30) Foreign Application Priority Data
Dec. 12, 2011  (FR) ..................... 11 61487

(51) Int. Cl.
*F16C 11/04* (2006.01)
*B81B 3/00* (2006.01)
*G01P 15/02* (2013.01)

(52) U.S. Cl.
CPC ............... *F16C 11/04* (2013.01); *B81B 3/00* (2013.01); *B81B 3/0051* (2013.01); *G01P 15/02* (2013.01);
(Continued)

(58) Field of Classification Search
CPC .. B60R 2021/01516; F16C 11/04; G01B 7/30
(Continued)

(56) References Cited

U.S. PATENT DOCUMENTS 5,629,794 A   5/1997  Magel et al.
6,360,035 B1  3/2002  Hurst, Jr. et al.
(Continued)

OTHER PUBLICATIONS

French Preliminary Search Report issued Sep. 5, 2012 in Patent Application No. 1161487 (with English Translation of Category of Cited Documents).
(Continued)

*Primary Examiner* — Lisa Caputo
*Assistant Examiner* — Octavia Hollington
(74) *Attorney, Agent, or Firm* — Oblon, McClelland, Maier & Neustadt, L.L.P.

(57) ABSTRACT

A mechanical connection between two parts of a microelectromechanical and/or nanoelectromechanical structure forming a pivot with an axis of rotation pivot includes two first beams with an axis parallel to the pivot axis, the first beams configured to work in torsion, and two second beams with an axis orthogonal to the axis of the first beams, the second beams configured to work in bending, each one of the first and second beams being connected at their ends to the two parts of the structure.

19 Claims, 4 Drawing Sheets

(52) U.S. Cl.
CPC . *B81B 2203/0154* (2013.01); *B81B 2203/058* (2013.01); *Y10T 403/32606* (2015.01)

(58) Field of Classification Search
USPC .................................................. 73/862.381
See application file for complete search history.

(56) References Cited

U.S. PATENT DOCUMENTS

| | | |
|---|---|---|
| 6,392,220 B1 | 5/2002 | Slater et al. |
| 6,798,729 B1 | 9/2004 | Hurst, Jr. et al. |
| 6,850,475 B1 | 2/2005 | Heanue et al. |
| 7,979,916 B2 * | 7/2011 | Pittenger et al. .................. 850/6 |
| 9,038,460 B2 * | 5/2015 | Walther ...................... 73/504.03 |
| 9,417,097 B2 * | 8/2016 | Robert ............... G01R 33/0286 |
| 2010/0017923 A1 | 1/2010 | Pittenger et al. |
| 2011/0147860 A1 | 6/2011 | Robert et al. |
| 2012/0279229 A1 | 11/2012 | Zinn et al. |
| 2012/0279300 A1 | 11/2012 | Walther |
| 2014/0318906 A1 | 10/2014 | Deimerly et al. |

OTHER PUBLICATIONS

U.S Appl. No. 14/654,748, filed Jun. 22, 2015, Walther.
U.S Appl. No. 14/737,761, filed Jun. 12, 2015, Jamaa, et al.
International Search Report issued Apr. 26, 2013, in PCT/EP2012/075278, filed Dec. 12, 2012.

* cited by examiner

MECHANICAL CONNECTION FORMING A PIVOT FOR MEMS AND NEMS MECHANICAL STRUCTURES

TECHNICAL FIELD AND PRIOR ART

The present invention relates to a pivot forming mechanical connection for MEMS ("microelectromechanical systems") and NEMS ("nanoelectromechanical systems") structures between two parts able to pivot with respect to each other.

In the state of the art, there are two technical solutions to make a pivot connection in MEMS and NEMS structures.

The first solution implements beams connecting for example the fixed part and the movable part and working in bending. The beams are provided in parallel to each other, and the axis of the pivot connection is orthogonal to the axis of the beams.

The second solution implements aligned beams, for example two in number, connecting the fixed part and the movable part, and working in torsion. The axis of the pivot connection and the axis of the beams are coincident.

MEMS and NEMS structures, for example used as a gyrometer or an accelerometer, use the movable part, being moved by a Coriolis force or acceleration respectively, as a detection means.

These structures can undergo mechanical disturbances of several types.

The first disturbance type is the inertial impact: an impact generates onto the MEMS structure a high inertial force: most specifications of MEMS or NEMS sensors demand resistance to impacts of 10000 g (1 g=9.8 m/s$^2$). From the mechanical point of view, the strain resulting on the structure is a pure force, i.e. without moment, applied to the centre of inertia of the structure and with the intensity F=ma, m being the mass and a, the acceleration. On the axis of rotation of the pivot connection, high moments can also be generated.

The second disturbance type is the magnetic impact: a MEMS or NEMS magnetometer has a movable element which can be moved by a magnetic field B. The movable element can be comprised of a magnetic material with a magnetising moment M. In the presence of a field B, a mechanical moment is generated and is equal to M×B. If the magnetic field has a high intensity, the mechanical strain can damage the MEMS structure.

The third disturbance type is the interference movement: any MEMS or NEMS sensor is subjected to inertial forces when the sensor has a non-uniform movement. These forces can generate undesired movements of the MEMS or NEMS structure. These can produce an interference signal in the measurement signal from the sensor, for example a sensitivity of the magnetometer or pressure sensor to an acceleration, a cross sensitivity, etc.

Yet, a pivot connection formed by bending beams or torsion beams does not enable all the amplitudes of the translation movements to be reduced along the three spatial directions and the rotation movements about directions orthogonal to the axis of the pivot connection. In other words, a pivot connection exclusively formed by either type of beam does not ensure high stiffnesses according to these degrees of freedom.

Further, the miniaturization of the MEMS and NEMS systems results in using increasingly small connection beams in order to preserve high performance kinematic connections between the different elements of the system. However, the reduction of the transverse cross-sections of these beams strongly decreases their transverse stiffnesses. The displacement sensitivities, which are proportional to the inverse of the stiffness 1/k along the transverse directions, then become higher under these conditions.

These interference displacements can occur in the signal delivered by the sensor. For example, if the detection means are of the capacitive type comprising a movable electrode attached to the movable structure and an electrode attached to the fixed structure, in the most general case, the capacitance depends on all the degrees of freedom.

Measurement methods enable this interference signal to be reduced by virtue of the placement, for example, of bridges of capacitances having opposite dependencies, however the measurement methods are made more complex.

Besides, strain gauges can be integrated to the system in order to detect the movement between both structures. These have dimensions lower than those of the beams and can have mechanical stiffnesses higher than for the beams forming the pivot connection, because of their much smaller lengths. A high longitudinal stiffness is indeed desired in order to oppose to the rotation movement of the pivot connection: the stress generated in the gauges is in this way proportional to the rotation movement. These high stiffnesses along the three directions can raise problem in case of impact, because the elements having the highest stiffnesses are precisely the ones which oppose the forces generated by the impact: as a result, there is an increased risk of degradation of the gauges and connection elements with lower dimensions than those of beams forming the pivot, and thus an increased risk of degradation of the MEMS or NEMS.

The strain gauges are provided perpendicular to the axis of rotation of the pivot connection. Because of their high longitudinal and transverse stiffnesses, the gauges can block interfering movements, however they can, by way of compensation, be subjected to high and destructible strains. For example, in case of an impact lower than 10000 g, which is a usually used value, the gauges could be damaged and consequently, the system would become out of service.

In order to solve this problem of impact resistance, a solution consists in etching stops in proximity to the movable parts, in proximity to the structure zones that have the greatest displacement amplitudes. The latter have the function to block as quickly as possible the movement generated by the mechanical impact: once the part is blocked, the strains generated onto the brittle mechanical elements, such as the gauges, are distributed and very slightly increased. A dimensioning should be carried out on a case-by-case basis to ensure the impact resistance of the structure. However, this solution does not enable to solve the problem raised in any circumstance. The movements performed during a damage can have amplitudes much lower than one micrometer, which is the limit below which etching the spacings between the stop and the movable structure becomes difficult.

DISCLOSURE OF THE INVENTION

Consequently, one object of the present invention is to offer a pivot connection for MEMS and NEMS structures enabling any MEMS or NEMS structures proofed against mechanical disturbances to be made.

The object of the present invention is achieved by a mechanical connection between a first part and a second part, the second part being for pivoting with respect to the first part about a axis of rotation, the connection comprising at least a first and a second beams the axes of which are intersecting and defining a resulting pivot axis having an increased rigidity in the structure plane.

In one embodiment, the first beam parallel to the axis of rotation and extending between the first movable part and the second part and at least a second beam perpendicular to the axis of rotation and extending between the first part and the second movable part. The first beam works in torsion and the second beam works in bending.

In another embodiment, the resulting pivot axis is perpendicular to the bisector of the angle bounded by the axes of first and second beams.

The combination of both these types of beam offers high translation stiffnesses along three spatial directions and a high rotation stiffness about the two spatial directions being different from that of the axis of rotation. In case of impact, the strain gauges are then protected. And this beam combination enables a high sensitivity to the measured value to be obtained.

The mechanical connection provided enables, on the one hand, the amplitude of undesirable translation movements and rotation movements about axes other than that of the pivot connection to be reduced, which thus enables the mechanical structure to be made less sensitive to other potential sources of external disturbances, such as for example an acceleration for a magnetometer or an inertial force of a transverse axis in the case of an accelerometer, these undesired movements being capable of being responsible for crossed sensitivities in an accelerometer.

On the other hand, this mechanical connection provides the system with a higher mechanical impact strength. This property of the mechanical connection is very interesting in the field of inertial type sensors which require to preserve high masses to keep high sensitivities, but the connection elements of which are sought to be miniaturised, which leads to their becoming more brittle. The more brittle mechanical connection elements, such as strain nanogauges, are then protected because of the high stiffness of the pivot connection along the complementary 5 other degrees of freedom according to the invention. In the state of the art, these were the strain gauges that had the greatest stiffness and they did support these mechanical impacts.

In other words, the pivot axis of the mechanical connection results from the axis of rotation of at least one beam working in torsion and the axis of rotation defined by at least one beam working in bending.

In the first embodiment, preferably, the axis of rotation formed by the at least one beam working in torsion and the axis of rotation formed by the at least one beam working in bending are coincident. For this, at least one anchoring of the torsion beam to the fixed and/or movable part is located in proximity to the centre of the bending beam.

In the second embodiment, preferably, the angle formed between the axes of the first and second beams is equal to 90°.

A subject-matter of the present invention is therefore a mechanical connection between two parts of a microelectromechanical and/or nanoelectromechanical structure forming a pivot with an axis of rotation (Y) comprising at least one first beam and at least one second beam, each one of first and second beams being connected at theirs ends to the two parts of the structure, said first and second beams having axes intersecting at an intersection point and defining between them an angle and said first and second beams working in bending and in torsion such that the pivot axis of the mechanical connection is perpendicular to the bissector of said angle and is intersecting said first and second beams so as to enable said parts to be rotationally displaced about said pivot axis and prevent said parts from being translationally displaced along this axis.

Preferably, the intersection point of the axes of said first and second beams are woicnident with the centre of inertia of either of the parts or in proximity to the centre of inertia of either of the parts.

The angle bounded by the axes of both beams is advantageously between 20° and 160°. Yet more advantageously, it is equal to 90°.

Preferably, the distance between the intersection point and an anchor point of which beam onto one of the parts on the side of which is located the intersection point is at least equal to half a length of the first and second beams.

Another subject-matter of the present invention is therefore a mechanical connection between two parts of a microelectromechanical and/or nanoelectromechanical structure forming a pivot with an axis of rotation (Y) comprising at least one first beam provided in parallel the pivot axis, said first beam being for working in torsion, and at least one second beam, with an axis orthogonal to the axis of the first beam, said second beam being for working in bending, each one of the first and second beams being connected at theirs ends to the two parts of the structure so as to enable said parts to be rotationally displaced along said pivot axis and prevent said parts from being translationally displaced along this axis.

By axis of rotation of a connection between a solid A and a solid B, it is meant the straight line defined by a point O and a vector such that the kinematic torsor of the movable part A with respect to the fixed part B has at the point O a null speed (at the first order of the disturbance generating the movement) and a rotation vector, this kinematic torsor being itself the specific result of the actions of the mechanical strains produced by an external operator (inertial force, magnetic moment, actuating forces, etc.). In this definition, parts A and B are assumed to be undeformable, aiming that the planes of interface between these solids and the mechanical connection may be considered.

By "preventing from being translationally or rotationally displaced", it is meant a reduction by a factor higher than two of the amplitude of the displacements (translation or rotation) of parts A with respect to part B when the connection according to the invention is implemented relative to the amplitude which would be obtained by only considering a single type of (torsion of bending) beams for a same mechanical strain exerted by considering either the absence or the presence of strain gauges.

The offset in the axes of rotation defined for each type of (bending or torsion) beam is preferably located in a range within which the angle of rotation of the movable part A with respect to the fixed part B obtained with the connection according to the invention is higher than 1% of the minimum of rotation angles which would be obtained by only preserving a single type of beam for a same mechanical strain exerted in the absence of strain gauges by considering either the presence or the absence of strain gauges.

Each one of the first and second beams are connected at their ends to both parts of the structure so as to advantageously prevent said parts from being rotationally displaced off said pivot axis.

According to a feature of the invention, the first beam works in torsion along a first axis of rotation and the second beam works in bending defining a second axis of rotation, the pivot axis of said mechanical connection resulting from the first axis and the second axis and being parallel to the first and second axes.

Preferably, the first axis of rotation corresponding to the axis of the first beam and the second axis of rotation defined by the second beam are coincident.

Preferentially, the anchoring of the at least one first beam to the first part and/or second part is located in proximity to the centre of at the least one second beam.

The mechanical connection can comprise two first beams and/or two second beams.

Another subject-matter of the present invention is also to provide a microelectromechanical and/or nanoelectromechanical structure comprising two parts connected by a mechanical connection according to the invention.

The microelectromechanical and/or nanoelectromechanical structure advantageously comprises means for detecting the relative displacement of the two parts about the pivot axis.

The detection means are for example formed by at least one strain gauge suspended between both parts. Two strain gauges can be suspended between both parts, both gauges being provided on either side of the pivot axis with respect to a plane orthogonal to a plane of the structure.

Another subject-matter of the present invention is also to provide an inertial sensor comprising at least one structure according to the present invention, wherein one of the parts forms a fixed part and the other forms an inertial mass suspended to the fixed part by the mechanical connection. The sensor can be an accelerometer or a magnetometer or a gyrometer.

Another subject-matter of the present invention is also to provide a microactuator comprising at least one structure according to the present invention, one of the part forming a fixed part and the other forming a movable part suspended to the fixed part by the mechanical connection, and means for displacing the movable part with respect to the fixed part about the pivot axis, for example capacitive or electrostatic, piezoelectric, thermoelectric or magnetic type means.

BRIEF DESCRIPTION OF THE DRAWINGS

The present invention will be better understood using the description that follows and the appended drawings wherein.

DETAILED EXPOSURE OF PARTICULAR EMBODIMENTS

In the description that follows, the three directions ex, ey, ez will be considered orthogonal with respect to each other. Y designates the axis of the pivot connection according to the present invention, extending along the direction ey.

Figure 1:
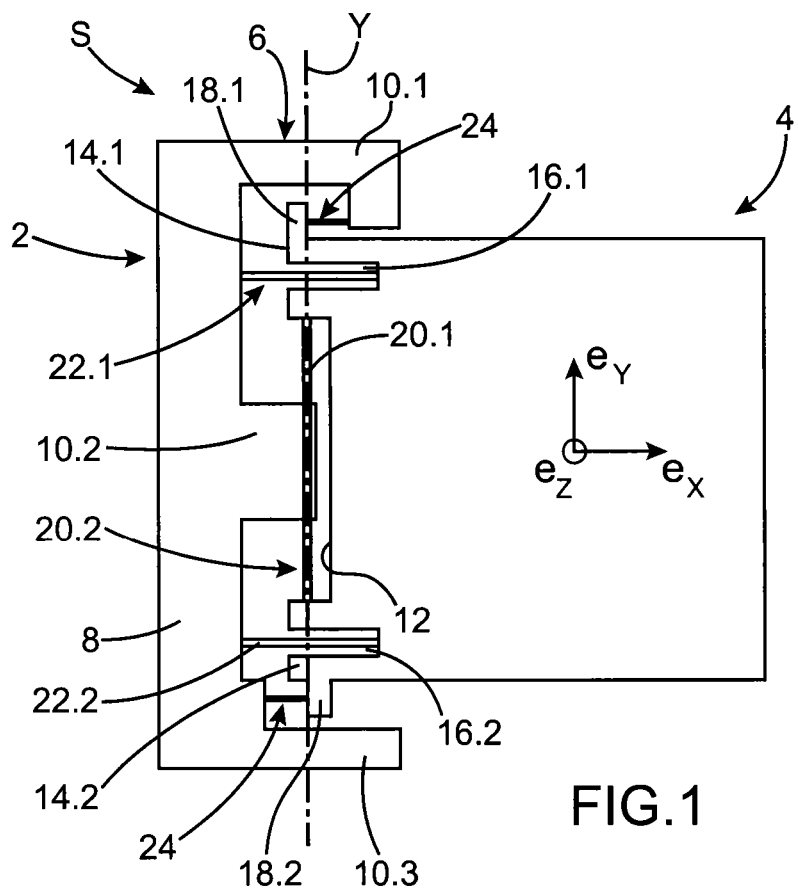
FIG. 1 is a schematical top view of a MEMS or NEMS structure provided with a pivot connection according to an example of a first embodiment of the present invention.

In FIG. 1, can be distinguished a MEMS or NEMS structure S comprising a fixed part 2, for example a substrate, a movable part 4 suspended with respect to the fixed part 2 and a pivot connection 6 with an axis Y connecting the fixed part 2 and the movable part. The axis Y will be designated "pivot axis" in the rest of the description.

The fixed part 2 could also be itself movable with respect to another part of the structure.

In the particular example represented in FIG. 1, the fixed part 2 comprises a main body 8 extending longitudinally substantially parallel to the axis Y and three legs 10.1, 10.2, 10.3 perpendicular to the main body 8, such that, when viewed from above, the fixed part is substantially E shaped.

The movable part 4 is substantially a rectangle shaped with an edge facing the fixed part comprising a recess 12 bounded by two end portions 14.1, 14.2.

The end portions 14.1, 14.2 each comprise a cut-out 16.1, 16.2 with an axis perpendicular to the pivot axis Y. Further, the end portions each extend by a lateral portion 18.1, 18.2, these lateral portions being parallel to the pivot axis Y.

The movable part is provided with respect to the fixed part such that the central leg 10.2 of the fixed part 2 is located between both end portions 14.1, 14.2.

The configurations of the fixed part and movable parts represented in FIG. 1 are in no way limiting and only form an advantageous exemplary structure enabling a pivot connection optimised according to the present invention to be made.

The pivot connection 6 comprises two first beams 20.1, 20.2 aligned with the pivot axis Y and connected by each one of their ends to the fixed part 2 and to the movable part 4.

The first beams 20.1, 20.2 connect the centre leg 10.2 of the fixed part 2 to the end portions 14.1, 14.2.

The two first beams work in torsion about the axis Y.

Generally the torsion beams define an axis of rotation identical with their axis.

The pivot connection also comprises two second beams 22.1, 22.2 provided perpendicular to the pivot axis Y and connecting the fixed part 2 to the movable part 4.

Each second beam 22.1, 22.2 is connected by a longitudinal end to the movable part in a zone of the fixed part 2 located between one of the end legs 10.1, 10.3 and the central leg 10.2 and by another end to the bottom of one of the cut-outs 16.1, 16.2 of the movable part 4.

Both beams 22.1, 22.2 work in bending.

Generally, the bending beams define an axis of rotation perpendicular to their longitudinal axis, the longitudinal position of the axis of rotation depends on the type of mechanical strain applied to the movable part.

By virtue of the shape of the movable and fixed parts of the structure represented, the anchoring of the first beams 20.1, 20.2 to the movable 4 and fixed 2 parts is located in proximity to the centre of the two seconds beams 22.1, 22.2, the axis of rotation defined by the first beams working in torsion and the axis of rotation defined by the second beams working in bending being then coincident. In this configuration, the pivot connection according to the invention is optimised.

In the example represented, the MEMS or NEMS structure S also comprises means for detecting the displacement of the movable part with respect to the fixed part 2. In the example represented, these detection means 24 are formed by strain gauges; a gauge connects a zone of the fixed part between the end leg 10.3 and the centre leg 10.2 and the lateral portion 18.2, and another gauge connects the lateral portion 18.1 of the movable part to an end of the end leg 10.1. Both gauges are each provided on either side of the pivot axis Y with respect to a plane orthogonal to the plane of the structure.

The gauges work in compression along their main axis. The strain gauges can for example be of the piezo-resistive gauge type, resonant strain gauge (the resonant frequency of a transverse deformation mode depends on the longitudinal strain) . . . By way of example, exemplary dimensions of the beams and strain gauges will now be given. The bending beam(s) has (have) a length between 5 µm and 1000 µm, a width between 0.1 µm and 100 µm, and a thickness between 1 µm and 100 µm. For example, the beam(s) has (have) a length of 50 µm, a width of 1 µm and a thickness of 10 µm.

The torsion beam(s) has (have) a length between 1 µm and 1000 µm, a width between 0.1 µm and 100 µm and a thickness between 1 µm and 100 µm. For example, the beam(s) has (have) a length of 25 µm, a width of 1 µm and a thickness of 10 µm.

The strain gauge(s) has (have) a length between 0.1 µm and 200 µm, a width between 0.01 µm and 500 µm and a thickness between 0.01 µm and 50 µm. For example, the strain gauge(s) has (have) a length of 5 µm, a width of 0.25 µm and a thickness of 0.25 µm.

A pivot connection wherein the axes of rotation defined by the first beams and the second beams respectively are offset, while remaining parallel, does not depart from the scope of the present invention, the rotation about the pivot axis is then enabled thanks to the other degrees of freedom of the two combined rotation connections, these connections being formed by the beam(s) working in bending and the beam(s) working in torsion. The efficiency of such a pivot connection is reduced with respect to a pivot connection wherein the axes of rotation are coincident. However, it offers an increased stiffness with respect to the pivot connections of the state of the art. A structure similar to that of FIG. 1 wherein the movable part 4 would not comprise cut-outs 16.1, 16.2, the second beams 22.1, 22.2 being then directly fixed to the edges of the end portions 14.1, 14.2 would have axes of rotation of the first beams and the second beams being not coincident.

The offset in the axes of rotation defined for each type of (bending or torsion) beam is preferably located in a range within which the rotation angle of the movable part 2 with respect to the fixed part 4 obtained with the connection according to the invention is higher than 1% of the minimum of the rotation angles that would be obtained by only preserving a single type of beam for a same mechanical strain exerted in the absence of strain gauges by considering either the presence or the absence of strain gauges.

The structure equipped with a pivot connection according to the invention has a strong stiffness along the direction $e_x$, and a strong impact strength along the direction $e_x$. Indeed, both beams 22.1, 22.2 working in bending provide the system with a high stiffness along the direction ex. The gauges 24 are thus protected by the bending arms in case of impact along the direction ex or any strain type having a force component along the direction ex. In the absence of gauges, the result in movement amplitude is strongly attenuated.

The structure according to the present invention also offers a strong stiffness along the direction ey and a impact strength along the direction ey. Indeed, the torsion beams provide the system with a high stiffness along the direction ey.

The gauges 24 which have a lower stiffness along this same direction are thus protected from the effects of the force component along the direction ey generated for example in case of an impact along the direction ey. In the absence of gauges, the movement amplitude resulting from this force component is strongly attenuated.

Finally, the structure offers a strong torsion stiffness about the direction ez and a force resisting to high intensity moments in O, O being located in the central leg 10.2 of the fixed part. Indeed, the second beams along the direction ex can oppose to a rotation movement along the direction ez by virtue of their great longitudinal stiffness. It is to be noted that the torsion stiffness about $e_z$ is all the more important that the beams are away from each other. This property can enable the strains supported by the gauges to be restricted. In the absence of gauges, the resulting movement amplitude is strongly attenuated.

Figure 2:
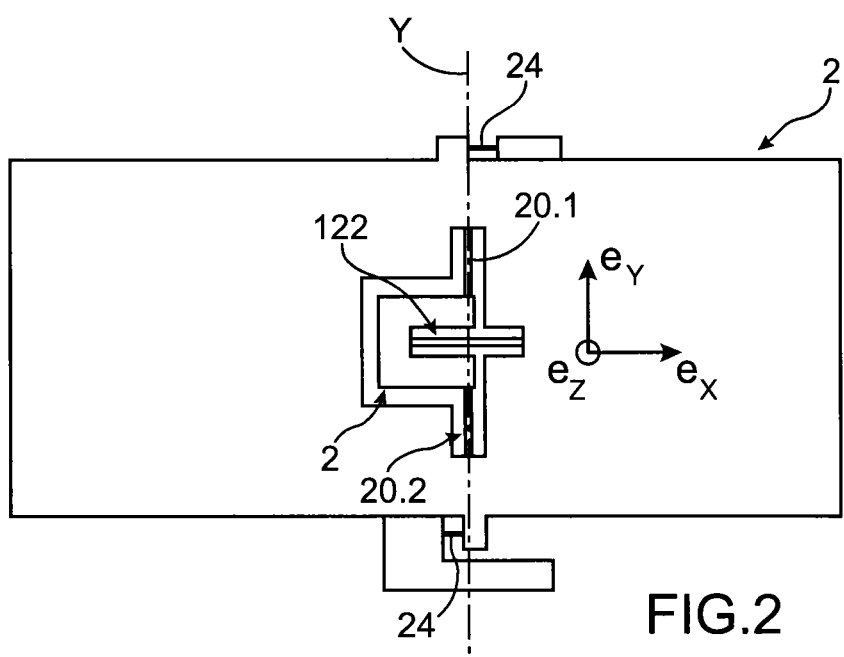
FIG. 2 is a schematical top view of a MEMS or NEMS structure provided with a pivot connection according to another example of the first embodiment of the present invention.

In FIG. 2, another exemplary embodiment of a structure wherein the pivot connection comprises two first beams 20.1, 20.2 working in torsion and a second beam 122 working in bending can be seen. The latter is provided between both first beams 20.1, 20.2. In the example represented, the movable mass 4 extends on either side of the pivot axis Y, such that its centre of inertia is on the axis of the pivot Y. This structure also comprises strain gauges connected between two lateral projections 18.1, 18.2 of the movable mass 4 and the fixed part. Advantageously, the torsion axis of the first beams 20.1, 20.2 intersects the second beam 122 at its middle.

This structure has the advantage to block the translation movement along the direction $e_y$ and along the direction $e_x$. In addition, the rotation movements about the directions $e_x$ and $e_z$ are all the more blocked that the torsion beams 20.1, 20.2 are away from each other.

Figure 3:
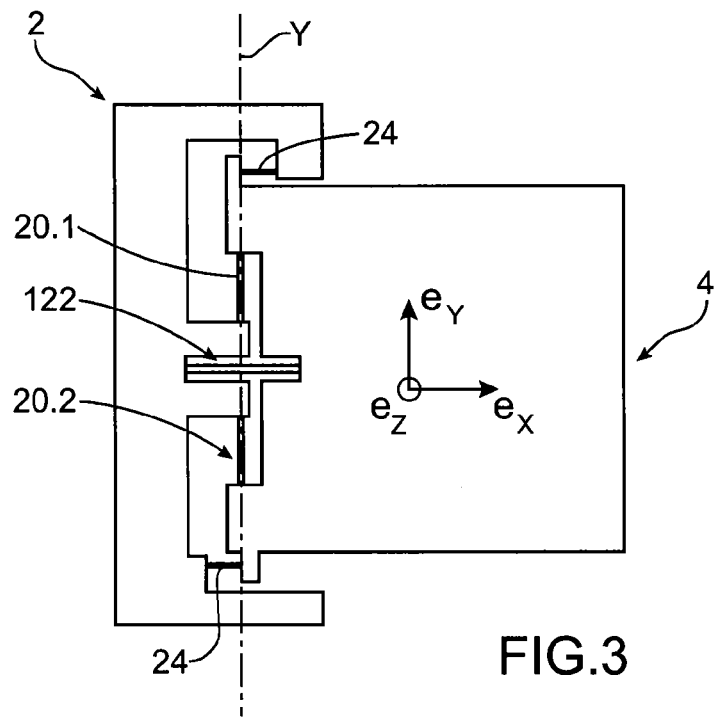
FIG. 3 is a schematical top view of a MEMS or NEMS structure provided with a pivot connection according to another example of the first embodiment.

In FIG. 3, another exemplary embodiment of a structure close to that of FIG. 2 can be seen, this differing from that of FIG. 2 in that the centre of inertia is off axis from the pivot Y. To this end, the axis of the pivot of the movable mass 4 is located on an edge of the movable mass 4. Advantageously, the torsion axis of the first beams 20.1, 20.2 intersects the second beam 122 at its middle.

Figure 4:
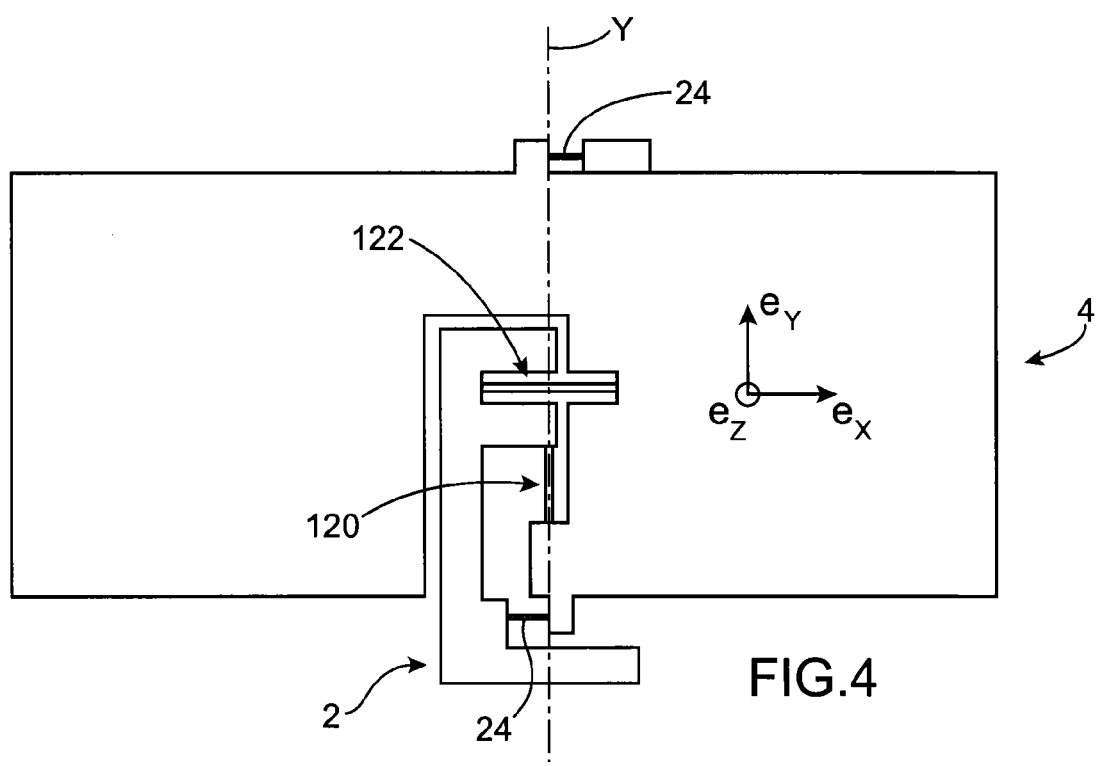
FIG. 4 is a schematical top view of a MEMS or NEMS structure provided with a pivot connection according to another example of the first embodiment.

In FIG. 4, another exemplary embodiment of a structure comprising a first beam 120 working in torsion and a second beam 122 working in bending can be seen. In this structure, the movable part 4 extends on either side of the pivot axis Y. This structure also comprises strain gauges connected between two lateral projections 18.1, 18.2 of the movable mass 4 and the fixed part. Advantageously, the torsion axis of the first beam 120 intersects the second beam 122 at its middle.

This structure has the advantage to block the translation movement along the direction $e_y$ and along the direction $e_x$. Furthermore, the rotation movements about the directions $e_x$ and $e_z$ are all the more blocked that the torsion beam 120 and the bending beam 122 are away from each other.

Figure 5A:
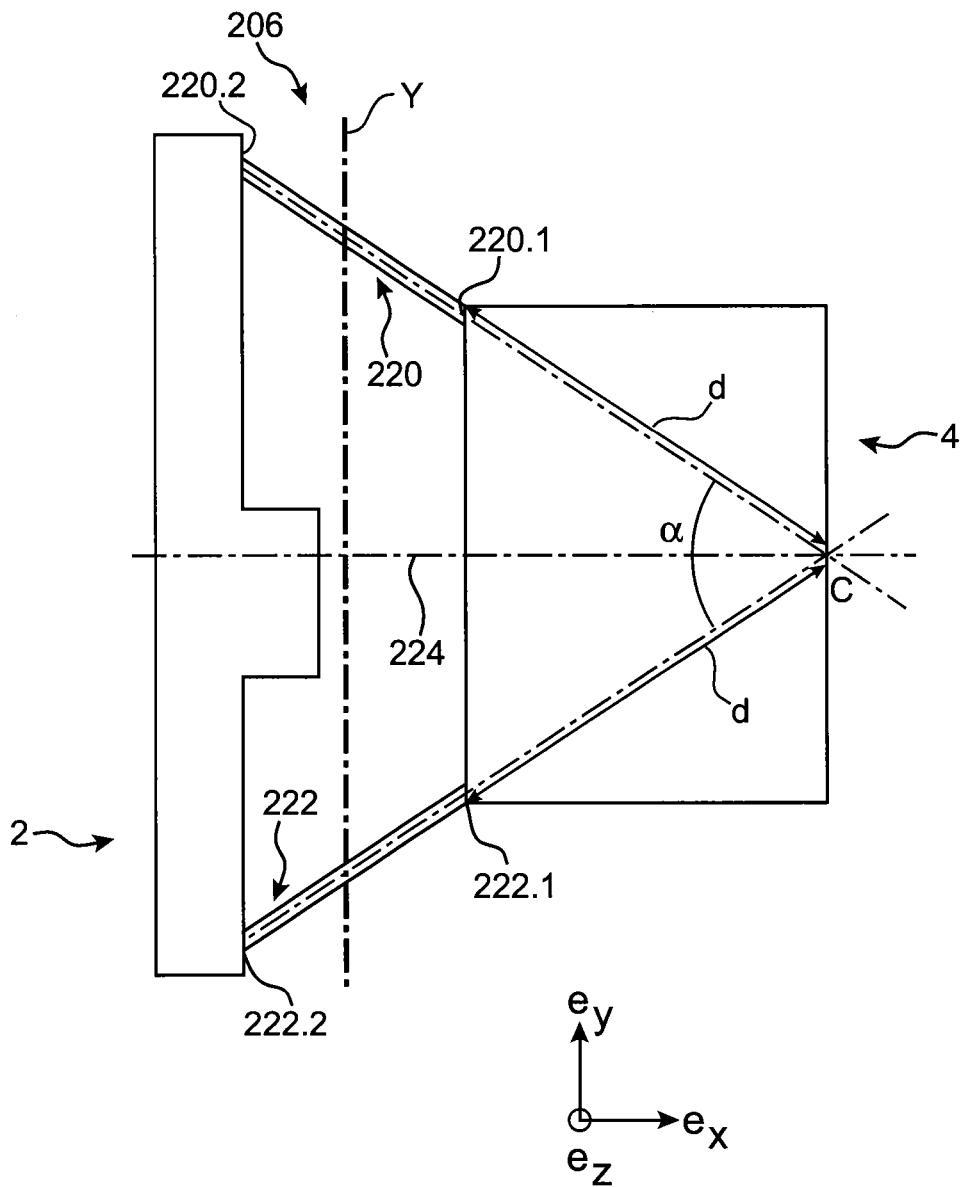
FIGS. 5A and 5B are top views of a MEMS or NEMS structure provided with a pivot connection according to examples of a second embodiment of the present invention.
Figure 5B:
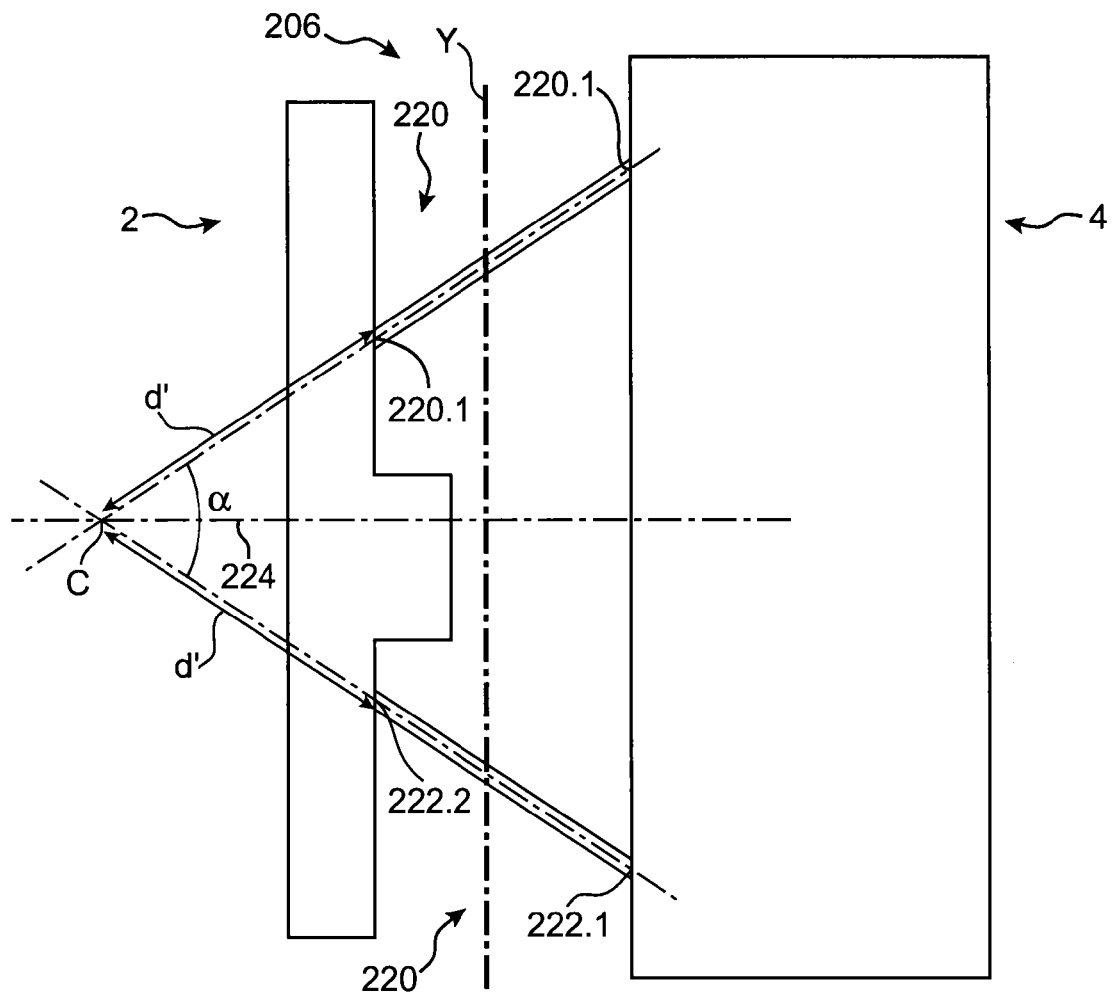

As illustrated in FIGS. 1 to 4, the pivot connection can comprise one, two or more than two first beams working in torsion and one, two or more than two beams working in bending without departing from the scope of the present invention. In FIGS. 5A and 5B, another exemplary embodiment of the mechanical connection wherein the axes of both beams are not necessarily orthogonal can be seen.

In FIG. 5a, the mechanical connection 206 has a pivot axis Y between the part 2 and the part 4. In the example represented, the mechanical connection comprises a first beam 220 and a suspension second beam 222 extending between the part 2 and the part 4 the axes of which are intersecting at a point C. In the example of FIG. 5A, the point C is located on the part 4. But this is in no way limiting, the point C could be located off the part 4, in FIG. 5B, the point C is located off the part 2.

In the example represented in FIG. 5A, the beams 220, 222 are anchored to the part 4 at their end 220.2, 222.2 respectively at two vertices of the part 4.

The beams 220, 222 work both in bending and torsion, they define the resulting pivot axis Y which is perpendicular to the bisector 224 of the angle α defined by both axes of the beams 220, 222. The pivot axis Y passes near the middle of the first 220 and second 222 beams.

The angle α is comprised in the interval]0°; 180[, so that the axes of both beams 220, 222 are not parallel. Preferably, α is between 20° and 160°. Thus, the mechanical connection has the wanted stiffness characteristics. For example, in the case where α is equal to 20° or 160° and the beams 220 and 222 are identical, their translation stiffness, regardless the axis considered in the plane of the beams, is at least equal to 12% of the maximum translation stiffness in this same plane. Whereas, in a pivot forming mechanical connection of the state of the art wherein the pivot axis is formed one or more torsion or bending biased beams, this translation stiffness is in the order of 1% to the maximum translation stiffness in this same plane. Thus, by virtue of this embodiment, the mechanical connection has an increased translation stiffness regardless the axis considered in the plane of the beams.

In a preferred example, the angle α is advantageously equal to 90°.

In this case, the translation stiffness of the pivot connection is identical regardless of the direction considered in the plane of the beams.

The rotation stiffness along the two other axes perpendicular to that of the axis of rotation wanted is all the more important that both beams are far from their intersection point. For example, the distance d between the intersection point C and the anchor point 220.1, from the beam 220 on the part 4 is selected equal to about at least once half the length of the beams, as well as that between the intersection point C and the anchor point 222.1 of the beam 222 on the part 4.

Preferably, the intersection point C and the centre of inertia of the movable part 4 are coicncidente or the intersection point C and the centre of inertia of the movable part 4 are located in the vicinity of each other On the exemplary embodiment of FIG. 5B, the intersection point C of the axes of the first and second beams is located on the side of the part 2 off the movable part 2. Preferably, the angle α is equal to 90° and preferably, the point C and the centre of inertia of the movable part 2 are coincident. As for the example of FIG. 5A, the distance d' between the intersection point C and the anchor point 222.1, of the beam 220, on the part 2 is selected equal to at least once half the length of the beams, as well as that between the intersection point C and the anchor point 222.2 of the beam 222 on the part 2.

Preferably, the beams are of close or identical length and dimensions. It will be however understood that a mechanical connection wherein both beams are of different lengths and/or different cross-sections and/or different shapes does not depart from the scope of the present invention.

On the other hand, the mechanical connection can comprise more than two beams intersecting at a point. For example, the mechanical connection can comprise three beams, two beams for example provided as in FIGS. 5A and 5B and a beam extending along the bisector of the angle bounded by both beams and anchored on the parts 2 and 4. According to another example, it can comprise four beams. Starting from the connection of FIGS. 5A and 5B comprising the first and second beams, this one would further comprises a pair of symmetrically distributed third and fourth beams such that the bisector of the angle they define and the bisector of the angle defined by the first and second beams are coincident. Such a mechanical connection would indeed be the combination of two mechanical connections with two beams according to the invention. The pivot axes defined by both these connections can be coincident, the pivot axis of the mechanical connection resulting from both these axes.

This mechanical connection according to this second embodiment enables a pivot connection to be made, between both parts, proofed to the mechanical disturbances which benefits from the mechanical characteristics similar to those of the first embodiment, i.e. the high translation stiffnesses along the three axes and important torsion stiffnesses along the two complementary other axes, impact strength, and which ensures a protection for the nanogauges.

The MEMS or NEMS structure according to the present invention can be manufactured with the conventional micro and nanoelectronic techniques, with steps of layer deposition, lithography and etching. Upon making a structure according to the present invention, and more particularly of the pivot connection, the axes of rotation of each one of the first and second beams are determined. For this, the connection beams of the other type are not taken into account upon calculating the mechanical behaviour of the structure. The particularly advantageous configuration of the exemplary embodiment represented in FIG. 1 is obtained when the two calculations for each type of beams provide the same axis of rotation.

The pivot connection according to the present invention is applicable to all the MEMS-NEMS structures having a rotation movement of one of their mechanical elements. The application fields relate in particular to the accelerometers, gyrometers, magnetometers, RF switches and microactuators, such as micromirrors, microsensors, etc.

Its integration into the existing MEMS and NEMS structures is simple and does not impose significant modifications as to their manufacturing method, consequently the manufacturing cost of the MEMS and NEMS structures according to the invention with respect to those of the state of the art is not increased.

The invention claimed is:

1. A mechanical connection between two parts of at least one of a microelectromechanical structure and a nanoelectromechanical structure forming a pivot with an axis of rotation, comprising:
   at least one first beam; and
   at least one second beam,
   each one of the first and second beams being connected at their ends to the two parts of the structure, and
   the first and second beams having axes intersecting at an intersection point and defining between them an angle, and the first and second beams working in bending and in torsion such that the pivot axis of the mechanical connection is perpendicular to the bisector of the angle and is intersecting the first and second beams so as to rotationally displace the two parts about the pivot axis and to prevent the two parts from being translationally displaced along the pivot axis.

2. The mechanical connection according to claim 1, wherein the intersection point of the axes of the first and second beams and a center of inertia of either of the parts are coincident or located in proximity to each other.

3. The mechanical connection according to claim 1, wherein the angle is between 20° and 160°.

4. The mechanical connection according to claim 1, wherein the angle is equal to 90°.

5. The mechanical connection according to claim 1, wherein a distance between the intersection point and an anchor point of each beam onto one of the parts on a side of which the intersection point is located is at least equal to half a length of the first and second beams.

6. A mechanical connection between two parts of at least one of a microelectromechanical structure and a nanoelectromechanical structure forming a pivot with an axis of rotation, comprising:
at least one first beam provided in parallel to the pivot axis, the first beam configured to work in torsion; and
at least one second beam, with an axis orthogonal to the axis of the first beam, the second beam configured to work in bending,
each one of the first and second beams being connected at their ends to the two parts of the structure so as to rotationally displace the two parts along the pivot axis and to prevent the two parts from being translationally displaced along the pivot axis,
wherein the first beam works in torsion along only one first axis of rotation and the second beam works in bending defining only one second axis of rotation, and
wherein the pivot axis of the mechanical connection results from the one first axis and the one second axis, and is parallel to the first and second axes.

7. The mechanical connection according to claim 6, wherein each one of the first and second beams are connected at their ends to the two parts of the structure to prevent the parts from being rotationally displaced off the pivot axis.

8. The mechanical connection according to claim 6, wherein the first axis of rotation corresponding to the axis of the first beam and the second axis of rotation defined by the second beam are coincident.

9. The mechanical connection according to claim 6, wherein anchoring of the at least one first beam to the first part and/or or the second part is such that the longitudinal axis of the at least one first beam is intersecting the longitudinal axis of the at least one second beam substantially at its middle.

10. The mechanical connection according to claim 6, wherein the at least one first beam comprises two first beams which define said only one first axis of rotation or the at least one second beam comprises two second beams.

11. The mechanical connection according to claim 6, wherein anchoring of the at least one first beam to the first part and the second part is such that the longitudinal axis of the at least one first beam is intersecting the longitudinal axis of the at least one second beam substantially at its middle.

12. The mechanical connection according to claim 6, wherein the at least one first beam comprises two first beams which define said only one first axis of rotation and the at least one second beam comprises two second beams.

13. At least one of a microelectromechanical structure and a nanoelectromechanical structure comprising two parts forming a pivot with an axis of rotation, comprising:
at least one first beam; and
at least one second beam,
each one of the first and second beams being connected at their ends to the two parts of the structure, and
the first and second beams having axes intersecting at an intersection point and defining between them an angle, and the first and second beams working in bending and in torsion such that the pivot axis of the mechanical connection is perpendicular to the bisector of the angle and is intersecting the first and second beams so as to rotationally displace the two parts about the pivot axis and to prevent the two parts from being translationally displaced along the pivot axis.

14. The at least one of a microelectromechanical structure and a nanoelectromechanical structure according to claim 13, comprising means for detecting relative displacement of both parts about the pivot axis.

15. The at least one of a microelectromechanical structure and a nanoelectromechanical structure according to claim 14, wherein the detection means includes at least one strain gauge suspended between both parts.

16. The at least one of a microelectromechanical structure and a nanoelectromechanical structure according to claim 14, wherein the detection means includes two strain gauges suspended between both parts, both strain gauges being provided on either side of the pivot axis with respect to a plane orthogonal to a plane of the structure.

17. An inertial sensor comprising the at least one of a microelectromechanical structure and a nanoelectromechanical structure according to claim 13, wherein one of the parts forms a fixed part and the other forms an inertial mass suspended to the fixed part by the mechanical connection.

18. The inertial sensor according to claim 17, forming an accelerometer or a magnetometer or a gyrometer.

19. A microactuator, comprising:
at least one of a microelectromechanical structure and a nanoelectromechanical structure comprising two parts forming a pivot with an axis of rotation, comprising:
at least one first beam; and
at least one second beam,
each one of the first and second beams being connected at their ends to the two parts of the structure,
the first and second beams having axes intersecting at an intersection point and defining between them an angle, and the first and second beams working in bending and in torsion such that the pivot axis of the mechanical connection is perpendicular to the bisector of the angle and is intersecting the first and second beams so as to rotationally displace the two parts about the pivot axis and to prevent the two parts from being translationally displaced along the pivot axis,
wherein one of the parts forms a fixed part and the other forms a movable part suspended to the fixed part by the mechanical connection, and
means for displacing the movable part with respect to the fixed part about the pivot axis, said means being at least one of a capacitive or electrostatic, piezoelectric, thermoelectric, or magnetic type means.

* * * * *